United States Patent [19]

Wakayama et al.

[11] 4,336,419
[45] Jun. 22, 1982

[54] CONSTRUCTION FOR MOUNTING PLATE-LIKE ELECTRIC PARTS

[75] Inventors: Yoichi Wakayama; Tadao Kikuchi, both of Soma, Japan

[73] Assignee: Alps Electric Co., Ltd., Tokyo, Japan

[21] Appl. No.: 167,754

[22] Filed: Jul. 14, 1980

[30] Foreign Application Priority Data

Jul. 14, 1979 [JP] Japan .................. 54-97237[U]

[51] Int. Cl.³ .............................................. H05K 1/18
[52] U.S. Cl. ................................. 174/68.5; 361/401; 361/412
[58] Field of Search .................. 361/306, 401, 412; 174/68.5

[56] References Cited

U.S. PATENT DOCUMENTS

| 2,990,498 | 6/1961 | Evans | 361/401 |
| 3,040,214 | 6/1962 | Slavin | 361/401 |
| 3,049,647 | 8/1962 | Lincoln | 361/401 |
| 4,246,627 | 1/1980 | Poensgen | 361/405 X |

FOREIGN PATENT DOCUMENTS 793785  4/1958  United Kingdom .............. 361/412

Primary Examiner—Richard R. Kucia
Attorney, Agent, or Firm—Guy W. Shoup; Gerard F. Dunne

[57] ABSTRACT

A construction for mounting plate-like electric parts within insertion holes formed in a printed circuit board is described which has additional holes for releasing any gases formed by soldering the parts to the printed circuit board. These additional holes are formed contiguous with said insertion holes at positions spaced away from any electrodes of the plate-like electric parts.

3 Claims, 3 Drawing Figures

CONSTRUCTION FOR MOUNTING PLATE-LIKE ELECTRIC PARTS

BACKGROUND OF THE INVENTION

The present invention relates to a construction for mounting plate-like electric parts to printed circuit boards and the like.

Plate-like electric parts have generally been mounted to printed circuit boards or other substrates by forming holes in the printed board, inserting the plate-like electric parts such as chip capacitors in the holes to temporarily hold them therein, and soldering the electrodes formed on both surfaces of the plate-like electric parts to electrically conductive patterns of the printed board by the solder dipping method. To attain good soldering, a flux is often used during the solder dipping. During the soldering operation, however, the flux often undergoes decomposition, whereby gases are evolved. According to the conventional art, however, since the holes formed in the printed board have nearly the same size as the thickness of the plate-like electric parts, the holes are often blocked by the plate-like electric parts. Therefore, the evolved gases are trapped in the portions where the soldering is to be effected on the back surface of the printed board, resulting in poor adhesion between the plate-like electric parts and the electrically conductive patterns. In particular, large printed boards accommodating many electric parts are likely to capture large amounts of gases which hinder the soldering operation.

An object of the present invention therefore is to provide a construction for mounting plate-like electric parts, which does not hinder the soldering thereof even when gases are evolved.

Another object of the present invention is to provide a construction for mounting electric parts, which is suited when a plurality of electric parts are to be soldered at one time onto a piece of substrate by utilizing an automatic solder dipping method.

A further object of the present invention is to provide a printed board which is suited for the solder dipping method.

According to the present invention, the substrate for receiving the electric parts is formed with the normal insertion holes and additional holes contiguous therewith for allowing any gases formed during the soldering operation to escape.

Further objects and advantages of the present invention will become obvious from the following description in conjunction with the accompanying drawings.

PREFERRED EMBODIMENT OF THE INVENTION

Figure 1:
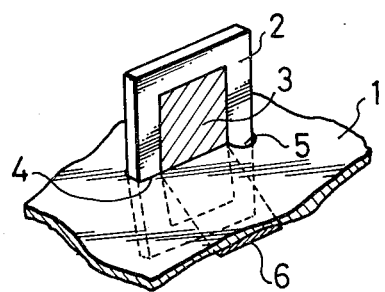
FIG. 1 is a perspective view of an embodiment according to the present invention.
Figure 2:
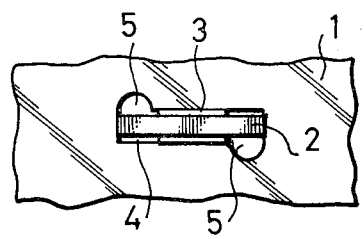
FIG. 2 is an upper view of a printed board according to the present invention.
Figure 3:
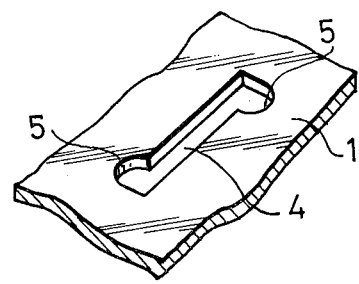
FIG. 3 is a perspective view of the printed board according to the present invention.

The invention is illustrated below with reference to an embodiment shown in FIGS. 1 to 3. Holes 5 for releasing gases are formed at both ends of an insertion hole 4 which is formed in a printed circuit board 1. The holes 5 are contiguous with the insertion hole 4 and are located at positions deviated from the electrodes 3 of a plate-like electric part 2 (refer to FIG. 2).

Therefore, when the plate-like electric part 2 is inserted in the insertion hole 4 formed in the printed board 1, the side surfaces of the plate-like electric part 2 come into contact with adjacent edges of the insertion hole 4, so that the positions of the electrodes of the platelike electric part 2 are fixed within the insertion hole 4. In this case, holes 5 for releasing gases have been spaced away from the electrodes of the part 2, and relatively large gaps are formed between the plate-like electric part 2 and the printed board 1 owing to these holes 5. When the electrodes of the part 5 are soldered to circuit patterns on the printed circuit board by the solder dipping method, any gases produced by the flux escape upwardly through the holes 5. Hence, since the holes 5 for releasing gases are spaced away from the electrodes 3, the soldering of the electrodes to the circuit patterns can be effected firmly.

According to the present invention as illustrated in the foregoing, holes 5 for releasing gases are formed contiguous with the hole 4 which is formed in the printed circuit board 1 to hold the plate-like electric part 2. Therefore, good soldering can be effected by permitting gases to escape during the step of soldering. Further, since holes 5 for releasing gases are spaced away from the electrodes 3 of the plate-like electric part 2, the soldering can be effected firmly without causing the electrically conductive pattern 6 on the printed circuit board to contract.

It should be also noted that the holes 5 for releasing gases according to the present invention are in no way limited to those illustrated in the abovementioned embodiment, but can be formed in a variety of other shapes.

What is claimed is:

1. A construction for mounting plate-like electric parts having exposed leads extending along opposite sides thereof to a substrate, comprising: a substrate having electrically conductive patterns on one surface thereof and at least one elongated insertion hole extending through said substrate; a respective plate-like electric part adapted to be inserted in each said insertion hole with its exposed leads held by the edge portions of the respective hole and adapted to be soldered to an electrically conductive pattern; and means including holes formed contiguous with said insertion holes but separated from said exposed leads for allowing escape of any gases formed during soldering of said electric part to the conductive pattern.

2. A printed circuit board comprising: electrically conductive patterns carried on one surface of the board; at least one elongated insertion hole extending through said board and each adapted to receive a respective electric part having exposed leads extending along opposite sides thereof; and means including holes formed continguous with said insertion holes but spaced from said exposed leads for allowing escape of any gases formed during soldering any electric part within its respective insertion hole.

3. A printed board according to claim 2, wherein said holes for allowing escape of gases are formed at the end portion of said insertion holes.

* * * * *